US006284569B1

(12) United States Patent
Sheppard et al.

(10) Patent No.: US 6,284,569 B1
(45) Date of Patent: Sep. 4, 2001

(54) METHOD OF MANUFACTURING A FLEXIBLE INTEGRATED CIRCUIT PACKAGE UTILIZING AN INTEGRATED CARRIER RING/STIFFENER

(75) Inventors: Robert P. Sheppard, Redbluff; Edward G. Combs, Foster City, both of CA (US)

(73) Assignee: ASAT, Limited, Tsuen Wan (HK)

( * ) Notice: Subject to any disclaimer, the term of this patent is extended or adjusted under 35 U.S.C. 154(b) by 0 days.

(21) Appl. No.: 09/309,248

(22) Filed: May 10, 1999

Related U.S. Application Data

(62) Division of application No. 09/020,903, filed on Feb. 5, 1998, now Pat. No. 6,111,324.

(51) Int. Cl.⁷ .................................................. H01L 21/48
(52) U.S. Cl. ........................ 438/110; 438/124; 438/126; 438/127
(58) Field of Search .................................. 438/106, 108, 438/110, 112, 113, 118, 119, 124, 126, 127, 460, 462, 464, 111; 29/841, 855; 257/778, 787, 735, 670; 264/272.17

(56) References Cited

U.S. PATENT DOCUMENTS 5,023,202 * 6/1991 Long et al. ........................... 438/112
5,044,912   9/1991 Billings et al. ....................... 425/116
5,101,322 * 3/1992 Ghaem et al. ........................ 361/386
5,173,766 * 12/1992 Long et al. ............................ 257/687
5,635,671   6/1997 Freyman et al. ..................... 257/787
5,652,185 * 7/1997 Lee ....................................... 438/113
5,854,741 * 12/1998 Shim et al. ........................... 361/813
6,013,947 * 1/2000 Lim ....................................... 257/685
6,111,324 * 8/2000 Sheppard et al. .................... 257/787
6,125,232 * 12/2000 Tieber et al. ........................ 29/25.01
6,187,654 * 2/2001 Tieber .................................. 438/464
6,214,645 * 4/2001 Kim ...................................... 438/110

* cited by examiner

*Primary Examiner*—Olik Chaudhuri
*Assistant Examiner*—Alonzo Chambliss
(74) *Attorney, Agent, or Firm*—Gallagher & Lathrop; Thomas A. Gallagher

(57) ABSTRACT

A carrier ring provides a stiffening function for assembling flexible circuits or semi-rigid circuits. The carrier ring is attached to a substrate adapted for attachment of a matrix of semiconductor dies. The carrier ring is provided with mold gates and mold vents for use with a transfer molding step to provide encapsulation for the semiconductor dies. Alignment and indexing marks on the carrier ring allows use of conventional assembly process flows in conventional assembly equipment. The height of the carrier ring also provides a means of providing integrated circuits with a predetermined thickness.

11 Claims, 3 Drawing Sheets

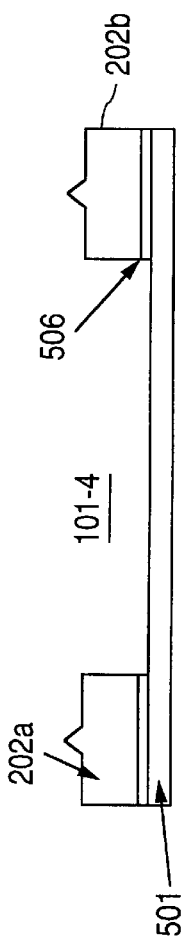
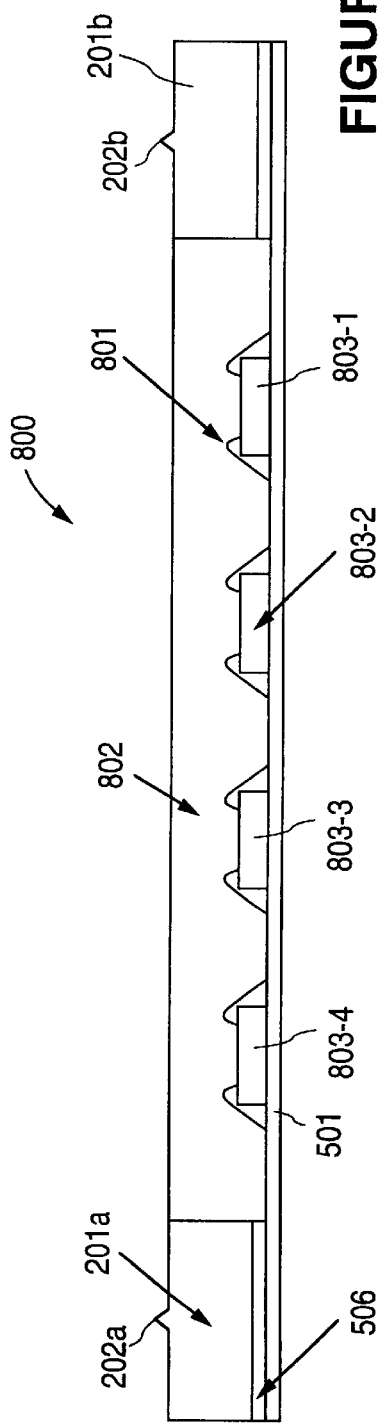
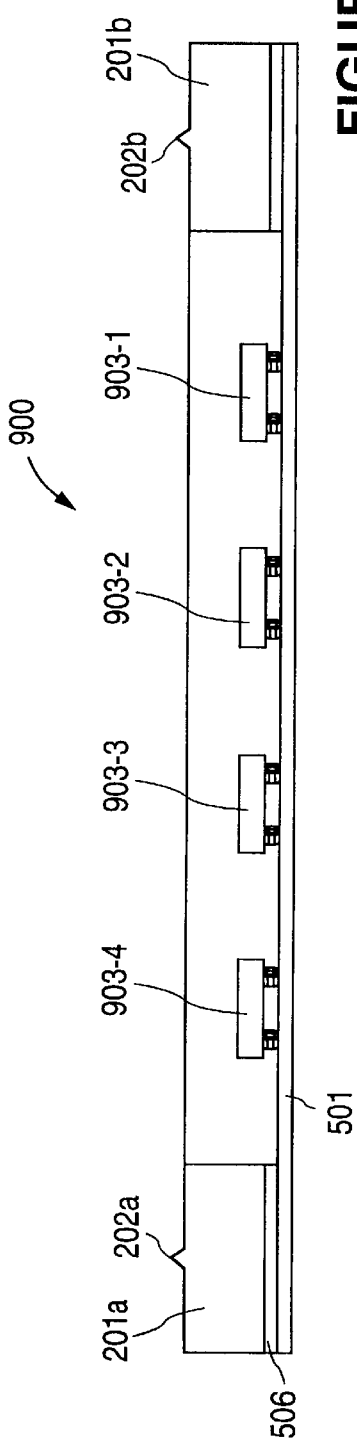

US 6,284,569 B1

METHOD OF MANUFACTURING A FLEXIBLE INTEGRATED CIRCUIT PACKAGE UTILIZING AN INTEGRATED CARRIER RING/STIFFENER

This is a divisional application of Ser. No. 09/020,903 filed Feb. 5, 1998, now U.S. Pat. No. 6,111,324.

BACKGROUND OF THE INVENTION

1. Field of the Invention

The present invention relates to integrated circuit packaging technology. In particular, the present invention relates to an integrated carrier and stiffener for an integrated circuit package, and a method for manufacturing such a package.

2. Discussion of the Related Art

Flexible circuits, including ball grid array packages, and semi-rigid circuits, such as those using a printed circuit board material as a substrate, are small-footprint and high pin-count packages. Various techniques for making these circuits are disclosed, for example, in (1) U.S. Pat. No. 5,614,443 to Nakashima et al., entitled "METHOD FOR PRODUCING A FRAME MADE OF CONNECTED SEMICONDUCTOR DIE MOUNTING SUBSTRATE," issued on Mar. 25, 1997, and (2) U.S. Pat. No. 5,652,185 to Lee, entitled "MAXIMIZED SUBSTRATE DESIGN FOR GRID ARRAY BASED ASSEMBLIES," issued on Jul. 29, 1997.

In a tape-automated bonding ball grid array ("TBGA") package, for example, a semiconductor die is attached and conventionally bonded (e.g., using wire bonding, direct chip attach, or tape-automated bonding) to a polyimide substrate embedded with photolithographically developed conductive traces provided for interconnecting the input and output terminals of the semiconductor die to external terminals provided on the package. Typically, these external terminals are provided by an array of solder balls, or other conductive terminals (e.g., terminals suitable for eutectic reflow). In one implementation of a TBGA, the substrate, wire bonds and the semiconductor die are encapsulated in a resin using a transfer molding process or an encapsulation dispensed in the liquid form.

In the prior art, to maximize the benefits of automation in the assembly process, and to minimize retooling requirements, standard assembly process flows provide highly automated assembly for packages of a few standard size packages. The sizes of these standard size packages, however, do not bear a close relationship with the size of the actual semiconductor die, and hence increase the packaging material cost by incurring waste, and provide larger footprints when incorporated in systems. There is a need to minimize material costs, to accommodate a greater range of package sizes and at the same time, without compromising the advantages of standard assembly processes and tooling.

SUMMARY OF THE INVENTION

The present invention provides a carrier ring and a method for using such a carrier ring for assembling integrated circuits. The carrier can act as a stiffener for flexible or semi-rigid circuits during the assembly process. The same carrier can be used to manufacture integrated circuits packages of any size, so that retooling or customizing of conventional assembly equipment is not required. The carrier provide alignment and index holes or marks which can be used with conventional assembly equipment.

In one embodiment, the carrier includes a stiff carrier frame, provided in a strip form, which includes a row of annular portions each enclosing a cavity sized to accommodate an array of semiconductor dies. Included on the carrier are distinctive marks for use in automatic alignment and indexing operations of conventional assembly equipment in subsequent assembly steps. The stiff carrier frame can be provided by high temperature plastic capable of withstanding the temperature of a transfer molding process, when used in such transfer molding process, or low temperature plastic, when used in a liquid encapsulation process. Alternatively, the stiff carrier frame can also be machined from a metal of the requisite strength.

During a first step in the assembly process the stiff carrier frame is attached to a substrate by adhesive, which can be a thermal set adhesive dispensed in liquid, semi-liquid or preformed formats. Alternatively, the stiff carrier frame can be attached using other suitable adhesives, such as pressure sensitive or liquid adhesives. A conductive pattern can be provided on the substrate to which terminals of the semiconductor dies can be wire-bonded or directly attached, and external terminals or pins, such as solder balls or a lead frame coupled to the conductive pattern can be provided for external connections.

Suitable substrates to be used under the present invention includes single or multi-layer polyimide tapes, such as those used in tape-automated bonding applications, or-semi-rigid printed circuit boards.

In one embodiment of the present invention, the stiff carrier frame is designed for use with a transfer molding process. For that application, a protruding portion is provided on the annular portion of the stiff carrier frame. This protruding portion is adapted to provide a seal of the enclosed cavity against a transfer mold. In addition, the stiff carrier frame also provides a mold gate and a mold vent, wherein a mold gate to act as a conduit for introducing an encapsulation material and a mold vent to allow passage for air from the cavity during the transfer molding step.

The present invention also provides a method for assembling integrated circuits using the carrier provided above. In one embodiment, the stiff carrier frame provided above is attached to a substrate, aligned according to the corresponding distinctive marks on both the stiff carrier frame and the substrate. Thereafter, single or multiple semiconductor dies are attached to the substrate. The semiconductor dies can then be wire-bonded or direct chip attached, and then encapsulated. In one embodiment, the thickness of the stiff carrier frame is used to define a thickness of the encapsulation.

As mentioned above, when a transfer molding step is used, the protruding portion of the stiff carrier frame can be used to provide a seal for the cavity against a transfer mold. In addition, the mold gates and the mold vents built into the stiff carrier frame can be used to provide a conduit for introducing an encapsulation material and to provide a passage for air exuded from the cavity during the transfer molding step.

The semiconductor dies can be singulated from the carrier assembly without removing the stiff carrier frame. In one embodiment, the semiconductor dies are singulated by sawing through the stiff carrier frame using a wafer saw.

The present invention is better understood upon consideration of the detailed description below and the accompanying drawings.

BRIEF DESCRIPTION OF THE DRAWINGS

FIG. 7 shows a cross section of carrier assembly 600 along line A—A of FIG. 6.

FIG. 8 shows a cross section of an encapsulated site 800, showing carrier ring portions 201a and 201b, matrix substrate 501, wire-bonded semiconductor dies 803-1 through 803-4 and resin encapsulation 802.

FIG. 9 shows a cross section of an encapsulated site 900, showing carrier ring portions 201a and 201b, matrix substrate 501, direct chip attached semiconductor dies 903-1 through 903-4 and resin encapsulation 802.

DETAILED DESCRIPTION OF THE PREFERRED EMBODIMENTS

Figure 1:
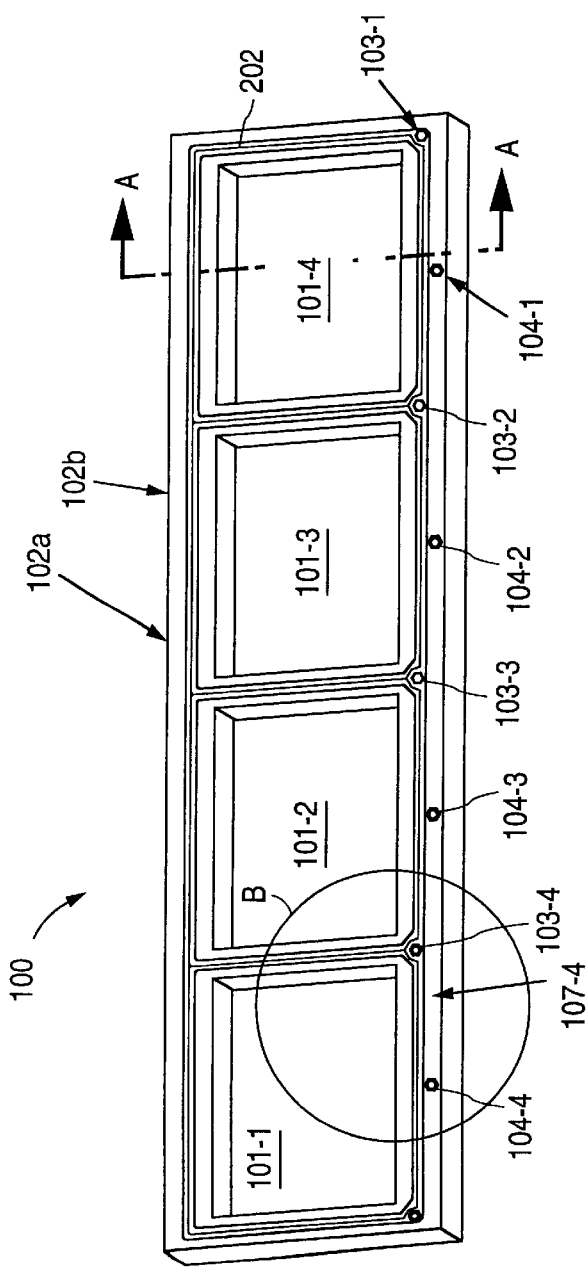
FIG. 1 shows a carrier ring 100 in accordance with the present invention.

In the following description, to simplify description and to facilitate identification of corresponding elements in the figures, like elements in the figures are provided like reference numerals.

The present invention provides a carrier, comprising a multiple-cavity strip, that can be used for packaging flexible or semi-rigid circuits. One embodiment of the present invention is provided in a carrier ring 100 shown in FIG. 1. As shown in FIG. 1, carrier ring 100 is provided in a strip form enclosing four cavities 101-1 to 101-4. The strip form of carrier ring 100 is designed to match the familiar strips used in conventional integrated circuit assembly processing. Carrier ring 100 provides alignment holes 103-1 to 103-4 and index holes 104-1 to 104-4 along a length of the strip to provide reference points to which sensors of standard commercially available assembly equipment can automatically align and index carrier ring 100 for processing. In manufacturing integrated circuits encapsulated using a transfer molding process, carrier ring 100 is preferably made of a high temperature plastic, such as the material commercially known as PAS or another suitable material, which is capable of withstanding the high transfer molding temperature. For that application, carrier ring 100 provides molding gates in regular intervals, e.g., molding gate 107-4 (shown in further detail in FIGS. 3 and 4 and discussed below), along one side of carrier ring 100, and molding vents 102a and 102b along an opposite side of carrier ring 100. Alternatively, carrier ring 100 can be provided by low temperature plastic for packages formed using liquid encapsulation package filling. Yet another material choice for carrier ring 100 is a metallic material. A metallic carrier ring can be formed, for example, by machining or etching.

Figure 2:
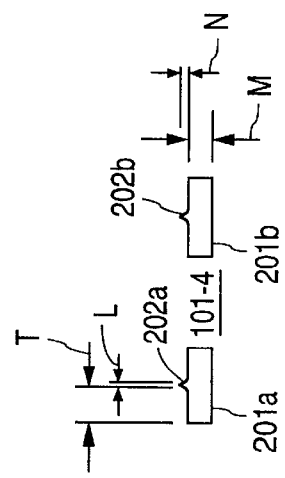
FIG. 2 shows a cross section of carrier ring 100 along a line A—A indicated in FIG. 1.

A cross section of carrier ring 100 along line segment A—A of FIG. 1 is provided in FIG. 2. As shown in FIG. 2, the cross section along the line segment A—A in FIG. 1 shows ring portions 201a and 201b on opposite sides of cavity 101-4. In this embodiment, portions 201a and 201b are each 0.6 mm thick and 6.346 wide. On top of carrier ring 100 is a protruding or ridge structure 202, represented in the cross section of FIG. 2 as ridge portions 202a and 202b. As discussed-below, ridge portions 202a and 202b, each 0.25 mm wide and 0.076 mm high in this embodiment, seal carrier ring 100 against the mold surface during a transfer molding process used for encapsulating the integrated circuits.

Figure 4:
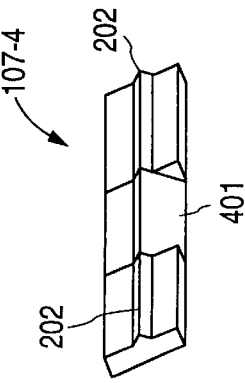
FIG. 4 shows in further detail the portion of carrier ring 100 including mold gate 107-4.
Figure 3:
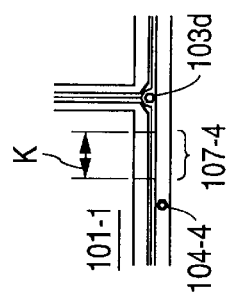
FIG. 3 shows in further detail a portion of carrier ring 100 indicated in FIG. 1 by a circle B.

FIG. 3 shows in further detail the portion of carrier ring 100 indicated by circle B. As shown in FIG. 3, between alignment hole 103-4 and index hole 104-4 is provided a mold gate 107-4, which is shown in further detail in FIG. 4. As shown in FIG. 4, mold gate 107-4 is formed by a 1.02 mm break in ridge structure 202 in the form of a slanting portion 401 which opens into cavity 101-1.

Figure 5:
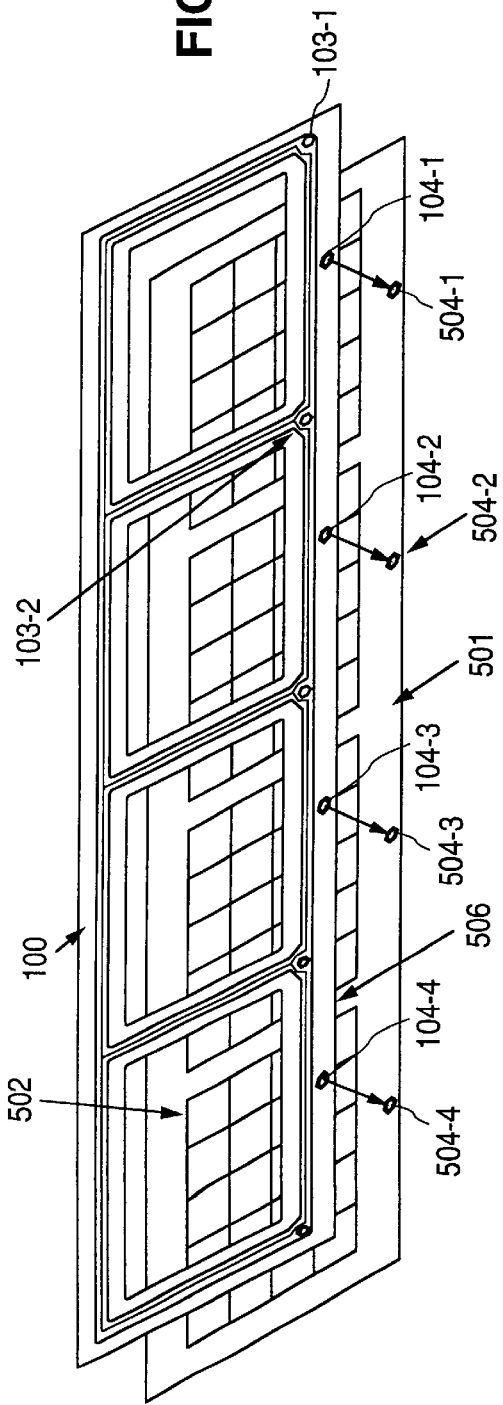
FIG. 5 shows an initial step of this process in which carrier ring 100 is attached by an adhesive to a "matrix substrate" 501.

An example of an assembly process in which carrier ring 100 can be used is next described in conjunction with FIGS. 5–8. FIG. 5 shows an initial step of this process in which carrier ring 100 is attached by an adhesive to a "matrix substrate" 501. Matrix substrate 501 can be, for example, a flexible polyimide tape, or a semi-rigid printed circuit board material, such as any of those materials known commercially as FR5, BT resin, or other suitable printed circuit board material. Matrix substrate 501 is attached to carrier ring 100 such that index holes 504-1 to 504-4, provided on matrix substrate 501, correspond to index holes 104-1 to 104-4 of carrier ring 100. Alignment of carrier ring 100 and matrix substrate 501 can be provided using alignment holes 103-1 through 103-4 relative to alignment marks on matrix substrate 501. So attached, carrier ring 100 acts as a stiffener for the flexible substrate packages and enhances rigidity for semi-rigid printed circuit board packages. In addition, since carrier ring 100 is designed to have dimensions and alignment and indexing features of a conventional strip used in standard assembly process flows and conventional equipment, subsequent assembly steps can be carried out without special or retooling of the conventional equipment.

On matrix substrate 501 are allocated, corresponding to each of cavities 101-1 to 101-4, a matrix of areas ("site") 502 (e.g., a 4×5 matrix of areas are provided in cavity 101-1). Each area in site 502 is designed to accommodate a single semiconductor die. For a BGA package, for example, the size of each area in a site can be made very close to the size of the semiconductor die, providing only sufficient clearance to satisfy tooling requirements (e.g., clearance for die-attach collets and wire-bond clamps), thereby minimizing waste of material. Thus, the number of semiconductor dies which can be accommodated in site 502 is determined by the package size. Matrix substrate 501 is attached to carrier ring 100 by an adhesive layer 506 applied between carrier ring 100 and matrix substrate 501 in areas outside of site 502. Suitable adhesive materials include a thermal set adhesive, dispensed in any of the liquid, semi-liquid or preformed formats. The adhesive should be dispensed, however, with controlled adhesive bleed to avoid contaminating site 502 and otherwise interfering with the remaining assembly process steps. The thickness of the cured adhesive is preferably controlled, so that the total package height at the end of the assembly process can be controlled. If the package is to be formed using a transfer molding process, the adhesive should be dispensed void free so as to prevent mold flash in the subsequent molding step.

Figure 6:
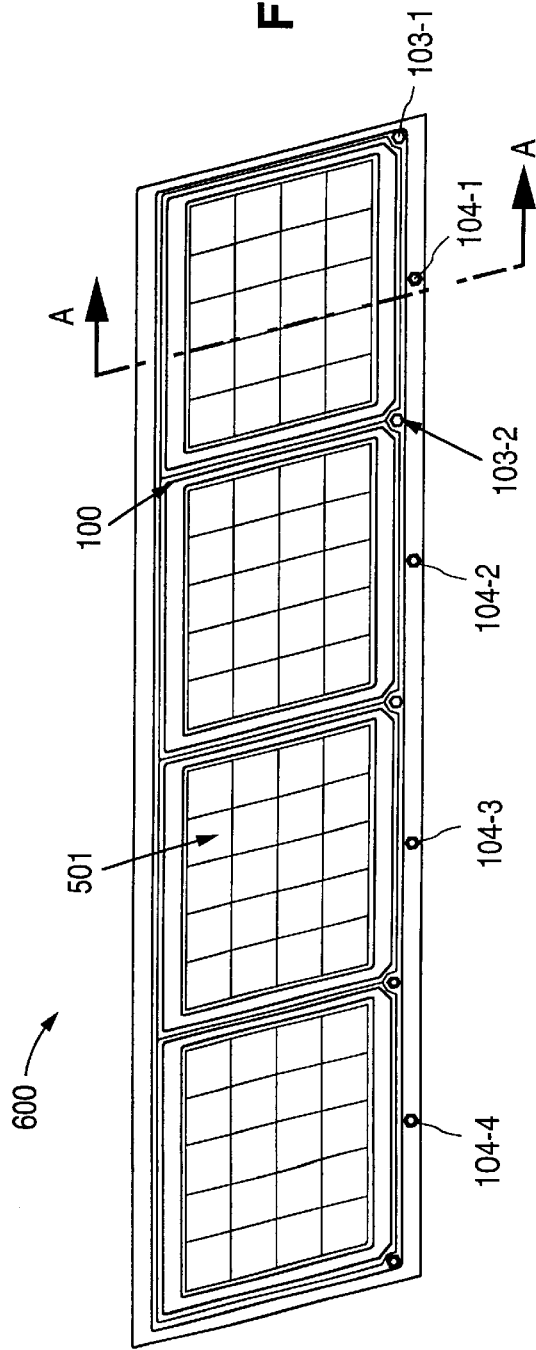
FIG. 6 shows carrier assembly 600 resulting from the attachment of carrier ring 100 to matrix substrate 501.

FIG. 6 shows carrier assembly 600 resulting from the attachment of carrier ring 100 to matrix substrate 501. FIG. 7 shows a cross section of carrier assembly 600 along line A—A of FIG. 6.

Semiconductor dies are then attached to site 502 of carrier assembly 600 and wire-bonded or direct chip attached using conventional assembly equipment. At this point, an electrical test can be performed to identify defective circuits. To minimize waste, a site including a defective die can be detached from carrier ring 100 and substituted by a site with fully functional dies, prior to the encapsulation step. The semiconductor dies are then encapsulated in a resin using the cavities 101-1 to 101-4 as mold cavities in a transfer molding process. As discussed above, during the transfer molding process, ridge structure 202 provide a good seal between the mold and carrier assembly 600. In the transfer molding process, the fluidized resin enters the sealed cavities 101-1 to 101-4 through mold gates 107-1 to 107-4 along a side of carrier assembly 600, displacing air in cavities 101-1 to 101-4 through mold vents along an opposite side of carrier assembly 600. Since the mold gates are provided in carrier assembly 600, and thus each molding is provided with new mold gates, there is no gate wear on the molds. Alternatively, encapsulation can be achieved using a liquid dispensed material. During the encapsulation process, the height of carrier ring 100 controls the mold or encapsulation height. Thus, the thickness of the resulting integrated circuit package can be provided by varying the thickness of carrier ring 100.

A cross section of an encapsulated site 800 is shown in FIG. 8. As shown in FIG. 8, wire-bonded semiconductor dies 803-1 through 803-4 are shown attached to matrix substrate 501. Portions 201*a* and 201*b* of carrier ring 100, which are attached by adhesive layer 506 to matrix substrate 501, as described above, control the height of encapsulation material 802. As mentioned above, electrical connection to terminals on semiconductor dies can be provided by a direct chip attach configuration. FIG. 9 shows a cross section of an encapsulated site 900, showing carrier ring portions 201*a* and 201*b*, matrix substrate 501, direct chip attached semiconductor dies 903-1 through 903-4 and resin encapsulation 802.

Subsequent to the encapsulation step, solder balls are attached to the under side of matrix substrate 501, to provide external electrical connections to the wire-bonded terminals of the semiconductor dies attached on the other side of matrix substrate 501. Conventional steps, such as solder ball flux cleaning and marking are then carried out. Finally, the packages are singulated in a precision sawing step using, for example, a conventional wafer saw. In this precision sawing step, carrier ring 100 is saw through and discarded.

The above detailed description is provided to illustrate the specific embodiments of the present embodiments and is not intended to be limiting. For example, the dimensions given above for various features of the specific embodiments are merely exemplary. Many variations and modifications within the scope of the present invention are possible. The present invention is set forth in the following claims.

We claim:

1. A method for assembling integrated circuits, comprising the steps of:

providing a stiff carrier frame in a strip form including (a) a plurality of annular portions each enclosing a cavity sized to accommodate a plurality of semiconductor dies and (b) distinctive marks thereon for allowing automatic alignment and indexing for subsequent assembly automation;

attaching a substrate to said stiff carrier frame also including a plurality of distinctive marks each aligned by said attaching step to a corresponding one of said distinctive marks of said stiff carrier frame; and attaching to a surface of said substrate said plurality of semiconductor dies.

2. A method as in claim 1, further comprising, subsequent to said step of attaching to a surface of said substrate said plurality of semiconductor dies, a step of encapsulating said semiconductor dies, wherein said stiff carrier frame being used to define a thickness of said encapsulation.

3. A method as in claim 2, wherein said step of encapsulating said semiconductor dies uses liquid encapsulant.

4. A method as in claim 2, further comprising, subsequent to said step of encapsulating said semiconductor dies, a step of singulating each of said semiconductor dies with removing said stiff carrier frame.

5. A method as in claim 1, wherein said step of singulating includes a step of sawing through said stiff carrier frame.

6. A method as in claim 2, wherein said step of encapsulating said semiconductor dies includes the step of transfer molding.

7. A method as in claim 6, wherein said step of providing said stiff carrier frame provides on each annular portion of said stiff carrier frame a protruding portion for providing a seal of said cavity against a transfer mold during said transfer molding step.

8. A method as in claim 6, wherein said stiff carrier frame is provided a mold gate and a mold vent, said mold gate providing a conduit for introducing an encapsulation material and said mold vent providing a passage for air exuded from said cavity during said transfer molding step.

9. A method as in claim 1, wherein said step of attaching said substrate includes a step of applying a thermal set adhesive between said stiff carrier frame and said substrate and controlling a thickness of said thermal set adhesive to a predetermined thickness.

10. A method as in claim 1, further comprising a step of wire-bonding terminals of said semiconductor dies to a preformed electrical patterns on- said substrate, wherein alignment of wire bonds in said wire-bonding step is accomplished by aligning to said distinctive marks of said stiff carrier frame.

11. A method as in claim 1, further comprising a step of attaching solder balls to a surface of said substrate opposite the surface of said substrate to which said semiconductor dies attach, said alignment of said solder balls during said step of attaching solder balls is provided by said distinctive marks on said stiff carrier frame.

* * * * *